United States Patent [19]

Learn et al.

[11] Patent Number: 5,320,680

[45] Date of Patent: Jun. 14, 1994

[54] PRIMARY FLOW CVD APPARATUS COMPRISING GAS PREHEATER AND MEANS FOR SUBSTANTIALLY EDDY-FREE GAS FLOW

[75] Inventors: Arthur J. Learn, Cupertino; Dale R. Du Bois, Los Gatos; Nicholas E. Miller, Cupertino; Richard A. Seilheimer, Pleasanton, all of Calif.

[73] Assignee: Silicon Valley Group, Inc., San Jose, Calif.

[21] Appl. No.: 691,470

[22] Filed: Apr. 25, 1991

[51] Int. Cl.$^5$ .................. C23C 16/00; C23C 16/46
[52] U.S. Cl. .................. 118/724; 118/725
[58] Field of Search .................. 118/715, 724, 725

[56] References Cited

U.S. PATENT DOCUMENTS

| | | | |
|---|---|---|---|
| 3,226,254 | 12/1965 | Reuschel | 118/725 X |
| 3,704,987 | 12/1972 | Arndt et al. | 118/48 |
| 3,805,736 | 4/1974 | Foehring et al. | 427/255.5 |
| 4,000,716 | 1/1977 | Kurata et al. | 118/5 |
| 4,062,318 | 12/1977 | Ban et al. | 118/49 |
| 4,227,347 | 10/1980 | Tam | 118/52 |
| 4,246,296 | 1/1981 | DiGioacchino et al. | 422/202 |
| 4,263,872 | 4/1981 | Ban | 118/721 |
| 4,339,645 | 7/1982 | Miller | 118/725 X |
| 4,468,283 | 8/1984 | Ahmed | 118/728 X |
| 4,509,456 | 4/1985 | Kleinert et al. | 118/715 |
| 4,539,933 | 9/1985 | Campbell et al. | 118/719 |
| 4,545,327 | 10/1985 | Campbell et al. | 118/725 |
| 4,554,180 | 11/1985 | Hirooka | 427/248.1 |
| 4,556,584 | 12/1985 | Sarkozy | 427/54.1 |
| 4,695,706 | 9/1987 | Mizushina | 118/725 X |
| 4,728,389 | 3/1988 | Logar | 156/612 |
| 4,770,590 | 9/1988 | Hugues et al. | 414/172 |
| 4,793,283 | 12/1988 | Sarkozy | 118/725 |
| 4,807,562 | 2/1989 | Sandys | 118/725 |
| 4,834,022 | 5/1989 | Mahawil | 118/725 |
| 4,877,651 | 10/1989 | Dory | 427/255 |
| 4,926,793 | 5/1990 | Arima et al. | 118/730 |
| 5,076,206 | 12/1991 | Bailey et al. | 118/724 |
| 5,091,219 | 2/1992 | Monkowski et al. | 118/719 |
| 5,127,365 | 7/1992 | Koyama et al. | 118/724 |

FOREIGN PATENT DOCUMENTS

| | | |
|---|---|---|
| 0164928 | 5/1985 | European Pat. Off. |
| 61-114522 | 6/1986 | Japan |
| 61-290713 | 12/1986 | Japan |
| 62-136810 | 6/1987 | Japan |
| 0245624 | 10/1987 | Japan |
| 1253229 | 10/1989 | Japan |
| 2103934 | 4/1990 | Japan |

Primary Examiner—R. Bruce Breneman
Assistant Examiner—Jonathan D. Baskin
Attorney, Agent, or Firm—Oblon, Spivak, McClelland, Maier and Neustadt

[57] ABSTRACT

A chemical vapor deposition apparatus comprising a hot wall reaction tube, one or more reaction gas preheaters, a reaction gas exhaust outlet, and substantially eddy free reaction gas flow control means for passing reaction gases in a substantially laminar flow from a preheater to the exhaust outlet. The gas flow control means includes a tube flange positioned to be in a substantially eddy free relationship with the end of the wafer boat zone, the flange having a curved surface means extending from the end of the wafer boat zone to the outer tube for directing the reaction gas flow out of or into the reaction zone while maintaining the gas in a state of substantially laminar flow. One reaction gas preheater comprises a first heating tube having a removable baffle. A second reaction gas preheater comprises a two wall cylindrical heater with inner surface deformations. The two wall cylindrical heater and the heating tube each can have a plurality of gas injector ports with central axes positioned to cause immediate mixing of gases injected therefrom. An alternate reaction gas preheater comprises the passageway formed by concentric vacuum and reaction chamber tubes.

4 Claims, 6 Drawing Sheets

PRIMARY FLOW CVD APPARATUS COMPRISING GAS PREHEATER AND MEANS FOR SUBSTANTIALLY EDDY-FREE GAS FLOW

FIELD OF THE INVENTION

This invention relates to an improved chemical vapor deposition apparatus. In particular, this invention relates to an apparatus for vapor depositing highly uniform coatings of selected elements and compounds on substrates with greatly decreased particle contamination of the surfaces being coated.

BACKGROUND OF THE INVENTION

Chemical Vapor Deposition (CVD) is the process of depositing a solid material from a gaseous phase onto a substrate by means of a chemical reaction. The deposition reaction involved is generally thermal decomposition, chemical oxidation, or chemical reduction.

The apparatus of this invention is a CVD apparatus primarily useful for coating semiconductor wafers in the manufacture of solid state electronic devices and energy conversion devices.

With the continuing reduction in integrated circuit component size and multiplication in the number of components per chip, particle contamination and resulting device defects have become an increasingly serious problem. Vertical and horizontal tube reactors use wafer boat assemblies which can be loaded by robot in a dust-free environment, reducing environmental particle contamination. However, these reactors produce contaminating particles in the coating process.

The CVD deposition process, itself, is a major source of particles which can contaminate wafer surfaces, create defects, and lower production yields of advanced devices. In reactions exemplified by the chemical vapor deposition of silicon nitride, for example, dichlorosilane and ammonia are heated to form a reactive mixture which coats the wafer surface with silicon nitride. Dichlorosilane and ammonia begin to react and form particles as soon as the mixed gases reach a threshold reaction temperature, and particulate contamination is unavoidable with the reactors available prior to this invention. In pyrolytic reactions such as the deposition of polysilicon from gaseous silanes, for example, particulate formation and contamination of wafer surfaces has also proven to be a major problem. Overheating the reactants away from the wafer surface and the presence of zones of recirculation or stagnation in the reaction vessel both contribute to particle formation. Formation of particles which can foul the semiconductor products is also a problem in other types of low pressure reactions.

The improved CVD apparatus and process of this invention greatly reduce particle formation and particulate contamination of wafer surfaces.

DESCRIPTION OF THE PRIOR ART

Hot wall CVD systems utilizing tube reactors in both vertical and horizontal configurations are known. In these systems, the wafers are supported in a wafer boat in a stack with the stack axis parallel to the tube axis. The reaction zone in which the wafers are positioned is heated by external sources such as resistance heating coils, and the reaction gases are heated as they enter the tube upstream of the wafers. In the vertical systems, the preloaded wafer boats are typically lifted from a position below the reactors to a position in the reaction zone. In these commercial systems, the configuration of the reactor permits eddies, swirls and circulating gas movements which promote entrained particle growth and contamination of semiconductor-wafer surfaces.

The reactants are heated to reaction temperatures before they reach the wafer surfaces, initiating gas phase reactions which produce particles which are entrained in the flowing gas and deposited on the wafer surfaces. In addition, in some reactor designs, reactants are depleted as the reaction gases flow along a stack, leading to reduced deposition rates and decreased coating thicknesses. To maintain wafer coating uniformity, this depletion is offset by increasing the gas temperatures (and reaction rates) along the stack. The gases are therein heated to temperatures substantially above the reaction threshold temperatures. This unavoidable overheating also initiates and continues the deposition reaction away from the wafer surface, producing contaminating particles.

SUMMARY AND OBJECTS OF THE INVENTION

The chemical vapor deposition apparatus of this invention comprises a hot wall reaction tube means, at least one reaction gas preheater and a reaction gas exhaust outlet. It also includes a substantially eddy-free reaction gas flow control means for passing reaction gases in a substantially laminar flow from a preheater to the exhaust outlet. The hot wall reaction tube means encloses a wafer boat zone for receiving a wafer boat preloaded with a stack of parallel substrates to be coated, with the wafer surfaces being substantially perpendicular to the central axis of the reaction tube, the wafer boat zone having an upstream end and a downstream end. The gas flow control means includes an upstream tube base positioned to be in a substantially eddy-free relationship with the upstream end of the wafer boat zone, and the reaction gas preheater comprises a means for separately preheating reactive gases and introducing them into a mixing zone positioned closely adjacent to the upstream end and also for optionally introducing reaction gases adjacent to the downstream end of the wafer boat zone. The gas flow control means optionally and preferably includes a downstream tube flange positioned to be in a substantially eddy free relationship with the downstream end of the wafer boat zone.

The chemical vapor deposition apparatus can be enclosed in an outer tube defining a vacuum chamber, the reaction tube and the outer tube having a space therebetween. The space has an inlet opening communicating with the downstream end of the wafer boat zone and comprising the exhaust outlet. The reaction gas preheater can comprise a primary reaction gas preheater comprising a removable two wall cylindrical heater with inner surface deformations providing a surface area selected to transfer a predetermined amount of heat to reaction gas passing over the internal surface deformations. The apparatus can also include a secondary reaction gas preheater comprising a heating tube with a removable baffle, the baffle having a surface area selected to transfer a predetermined amount of heat to reaction gas passing over the surface of the baffle. Preferably, the two wall cylindrical heater and the heating tube each have a plurality of gas injector outlet ports. The outlet ports of the cylindrical heater and the outlet ports of the heating tube preferably each have intersection central axes positioned to cause immediate mixing of gases injected therefrom.

In summary, the process of this invention for chemical vapor deposition comprises heating a reaction gas immediately upstream of a reaction zone containing reaction gas past the wafers in the reaction zone in laminar flow wherein the reaction gases are maintained in substantially laminar flow without significant eddies or turbulence; and removing the reaction gases from the reaction zone immediately after they pass the reaction zone. Optionally, preheated reaction gas can be also introduced at the downstream end of the reaction zone containing wafers to be coated.

A process of this invention for chemical vapor deposition using reactive gases comprises preheating reaction gases in separate heating chambers; mixing the preheated reaction gases immediately upstream of a reaction zone containing wafers to be coated; immediately passing the mixed reaction gases past the wafers in the reaction zone in laminar flow wherein the reaction gases are maintained in substantially laminar flow without significant eddies or turbulence; and removing the reaction gases from the reaction zone immediately after they pass the reaction zone. Preheated reaction gas can optionally be additionally introduced at the downstream end of the reaction zone containing wafers to be coated.

The processes of this invention are preferably carried out with the apparatus of this invention.

It is an object of this invention to provide a tubular CVD apparatus which reduces particulate contamination by maintaining the preheated reaction gas flow through the reaction chamber in a laminar pattern substantially free from eddies.

It is another object of this invention to provide a CVD apparatus which reduces particulate contamination by separately preheating reactive gases and mixing them immediately upstream of the wafer surfaces to be coated

DETAILED DESCRIPTION OF THE INVENTION

The chemical vapor deposition apparatus of this invention is a hot wall tube furnace which can have a horizontal orientation and preferably has the preferred vertical orientation. The description of the embodiments of the invention will be presented hereinafter in terms of an axially vertical orientation. However, the construction is equally suitable with a non-vertical axial orientation, and all orientations of the apparatus are intended to be included within the scope of this invention.

A critical feature of the apparatus of this invention is a design providing a laminar gas flow through the reaction chamber with a minimum of gas eddy patterns or swirls which might increase the retention time of molecules in the reaction zone. This has been achieved by modifying several components of the apparatus to provide several novel and inventive combinations which alone and together contribute to this objective.

Figure 1:
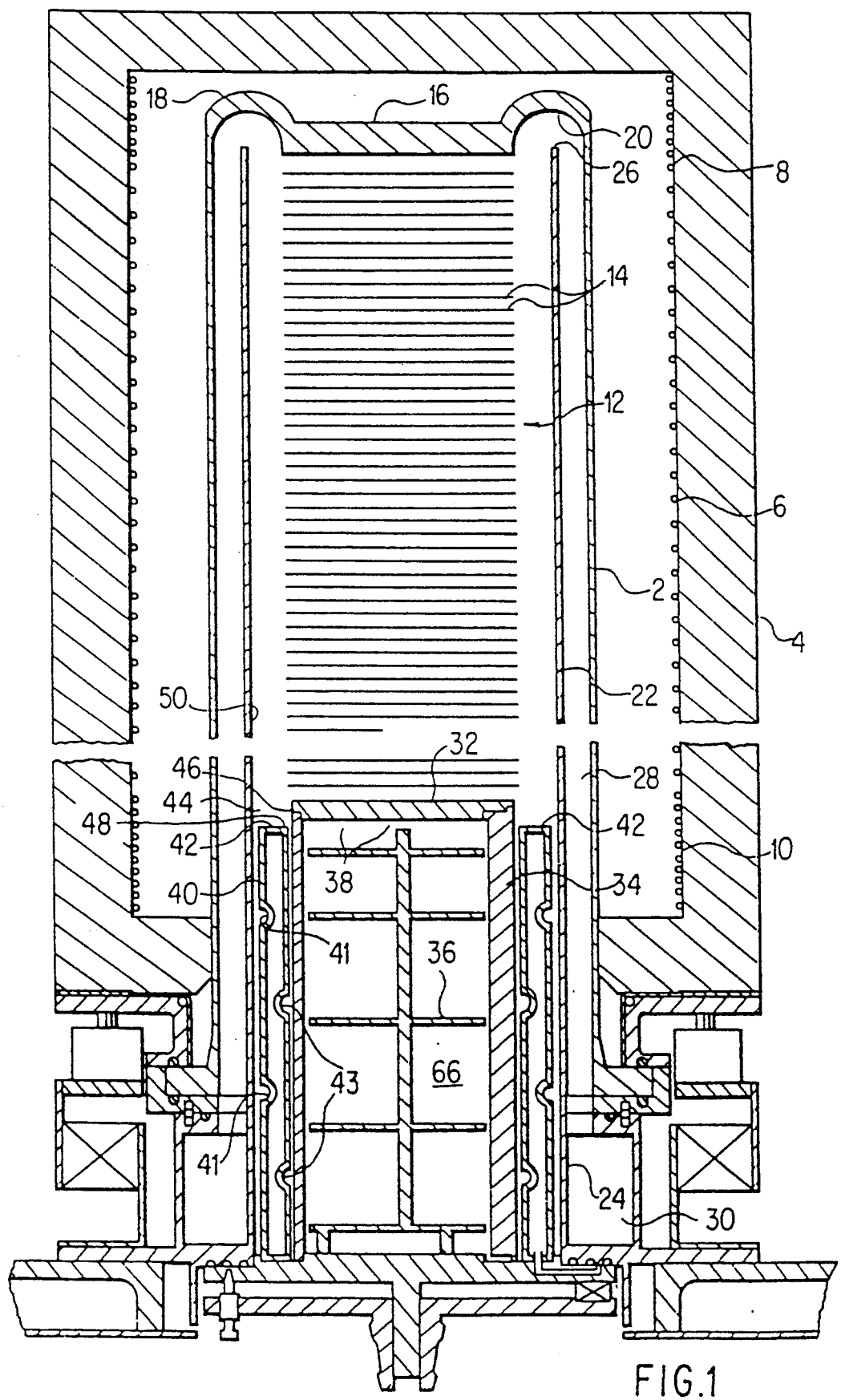
FIG. 1 is a cross-sectional view of one embodiment of a chemical vapor deposition apparatus according to this invention.

FIG. 1 is a cross-sectional view of one embodiment of a chemical vapor deposition apparatus according to this invention, characterized in having an upward flow of reaction gases along a wafer stack zone. The vacuum chamber tube 2 is enclosed in a cylindrical heater housing 4 with resistance heating elements 6. The end sections 8 and 10 of the resistance heating elements are more closely spaced to provide more heat at the ends of the reactor assembly, these being sites of maximum heat loss from the reaction zone. This can provide a more uniform or nearly isothermal temperature throughout the reaction zone, if desired.

The wafer boat zone 12 is represented by a stack of wafers 14. The upper end of the vacuum chamber tube includes a central disk 16 which abuts or is closely adjacent the upper (downstream) end of the wafer boat zone 12 to minimize or eliminate eddy space between the disk and the upper surface of a wafer boat therein. The curved tube flange 18 extends from the periphery of the head disk 16 to the upper (downstream) end of the vacuum chamber tube 2 and closes the end of the vacuum chamber tube. The inner surface 20 of the tube flange 18 is preferably curved, for example in the shape of a section of a torus, to maintain a laminar flow pattern of gases being directed thereby and to strengthen the support for the head disk 16 under a vacuum load.

The reaction zone surrounding the wafer boat zone is defined by cylindrical reaction tube 22. The tube 22 extends from a base 24 to a position adjacent the curved surface 20 of the tube flange 18. The upper (downstream) end 26 of tube 22 and the opposing surface 20 define an exhaust port for removing reaction gases from the reaction zone. The space 28 between the reaction tube 22 and the vacuum chamber tube 2 defines a cylindrical exhaust gas passageway for removing gas from the exhaust port to the vacuum exhaust system outlet plenum 30. The plenum 30 communicates with a conventional vacuum pump system (not shown).

The pedestal disk 32 supports the wafer boat and either contacts the lower surface of the wafer boat supported thereon or is closely adjacent thereto to eliminate a space within which a reaction gas eddy can occur.

The pedestal or base disk 32 can be the upper end closure of a secondary reaction gas injector defined by secondary heater cylinder 34. Removable baffle plate unit 36 is enclosed in the secondary reaction gas injector to heat reaction gas passing therethrough. It is designed to have the surface area required to heat reaction gas passing through the secondary heater to the desired exit temperature. If more or less heat is required, the baffle unit 36 can be replaced with a baffle unit having a respective greater or lesser surface or gas contact area. Secondary reaction gas injectors or outlet ports 38 direct heated reaction gas into the reaction zone.

Removable primary reaction gas heater 40 comprises two coaxial cylindrical walls defining a cylindrical passageway. The surface area of the inner (opposed) surface of the walls is increased by bumps 41 and 43 or other protuberances. It is designed to have the surface area required to heat reaction gas passing through the primary heater to the desired exit temperature. If more or less heat is required, the primary reaction gas heater 40 can be replaced by an assembly with a unit shaped to have respective greater or lesser surface area or gas contact area. Primary reaction gas injectors 42 direct heated reaction gas into the reaction zone.

The flow axis of the primary gas injectors 42 and the flow axis of the secondary gas injectors 38 are positioned to cause immediate mixing of the preheated reaction gases emitted therefrom, preferably with the axes intersecting. This is necessary to effect a coating reaction of two inter-reacting gases with the most upstream wafers since they are positioned closely adjacent to the gas injectors. Optimally, an annular mixing zone 44 is defined by the secondary heater surface 46, primary heater surface 48 and a wall area 50 of the adjacent reaction tube 22. The injectors 38 and 42 open into the mixing zone 44 and effect immediate mixing of reaction gases emitted therefrom in this zone. The gases exit at the desired reaction temperature.

The heating surfaces of the primary and secondary gas heaters and the lower areas of the reaction tube walls are heated by the heating elements 10 and the reaction gas exhaust gases passing down the exhaust gas passageway or space 28.

Reactant depletion in gases flowing upward along the sides of the wafer stack 14 can be offset by introducing a second supply of reactant gases at the downstream end of the wafer stack through conventional conduits (not shown), for example spaced conduits passing upward through space 12 from gas heater 40.

The apparatus of this invention provides easy automated loading and unloading of wafer boats into the wafer boat zone.

Figure 2:
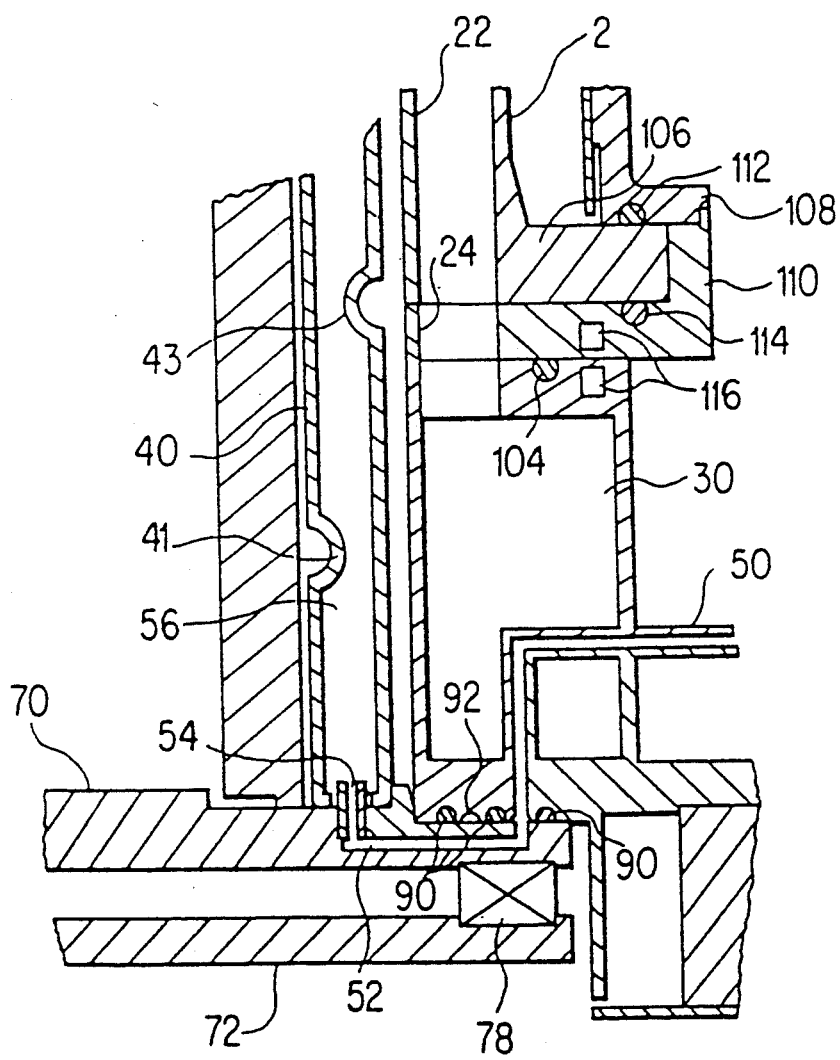
FIG. 2 is fragmentary cross-sectional view of the base of the chemical vapor deposition apparatus of FIG. 1 showing details of the process gas inlet to the primary injector and seals.

FIG. 2 is a fragmentary cross-sectional view of the base of the chemical vapor deposition apparatus of FIG. 1 showing details of the process gas inlet to the primary injector and seals. Primary reaction gas inlet supply conduit 50 extends through exhaust plenum 30 and communicates with base conduit 52 leading to outlet port 54 in the primary heater cavity 56.

Figure 3:
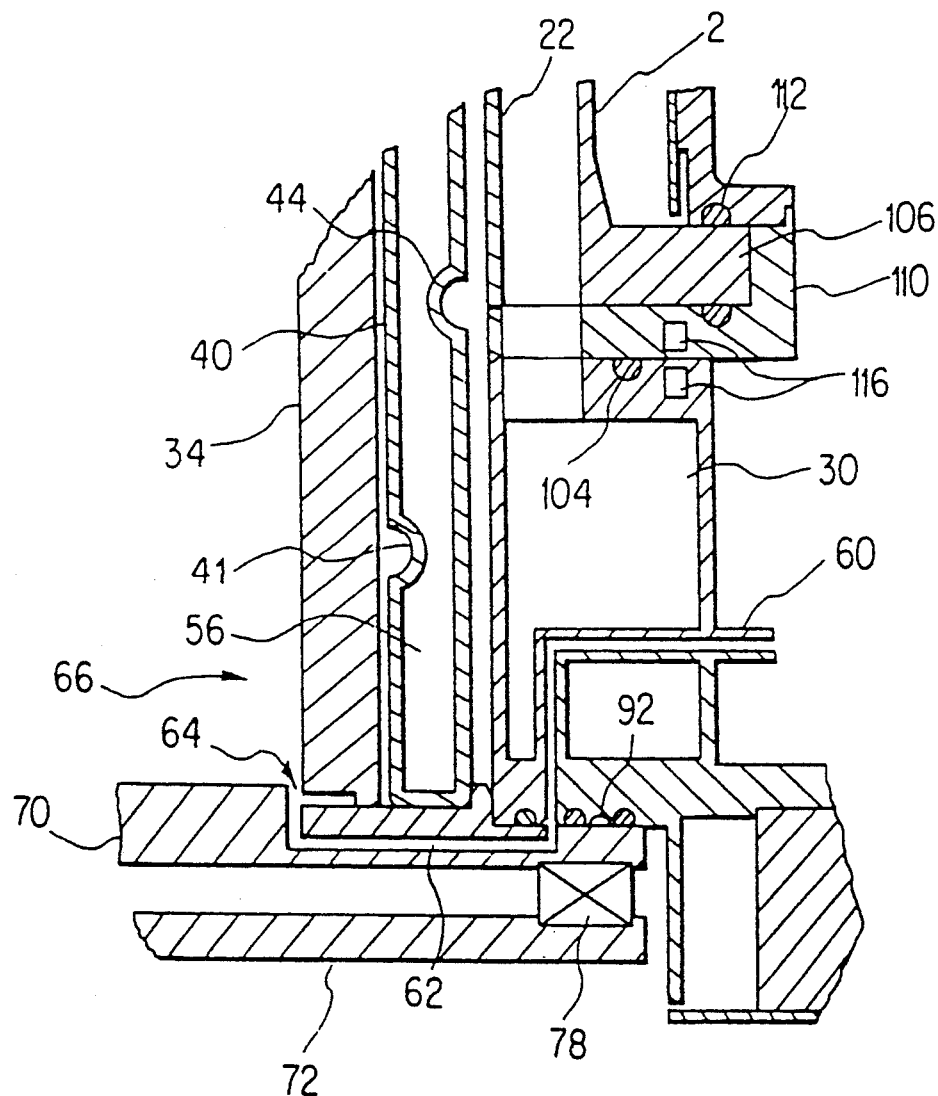
FIG. 3 is fragmentary cross-sectional view of the base of the chemical vapor deposition apparatus of FIG. 1 showing details of the process gas inlet to the secondary injector and seals.

FIG. 3 is a fragmentary cross-sectional view of the base of the chemical vapor deposition apparatus of FIG. 1 showing details of the process gas inlet to the secondary injector and seals. Secondary reaction gas inlet supply conduit 60 extends through exhaust plenum 30 and communicates with base conduit 62 leading to outlet port 64 in the secondary heater cavity 66.

Figure 4:
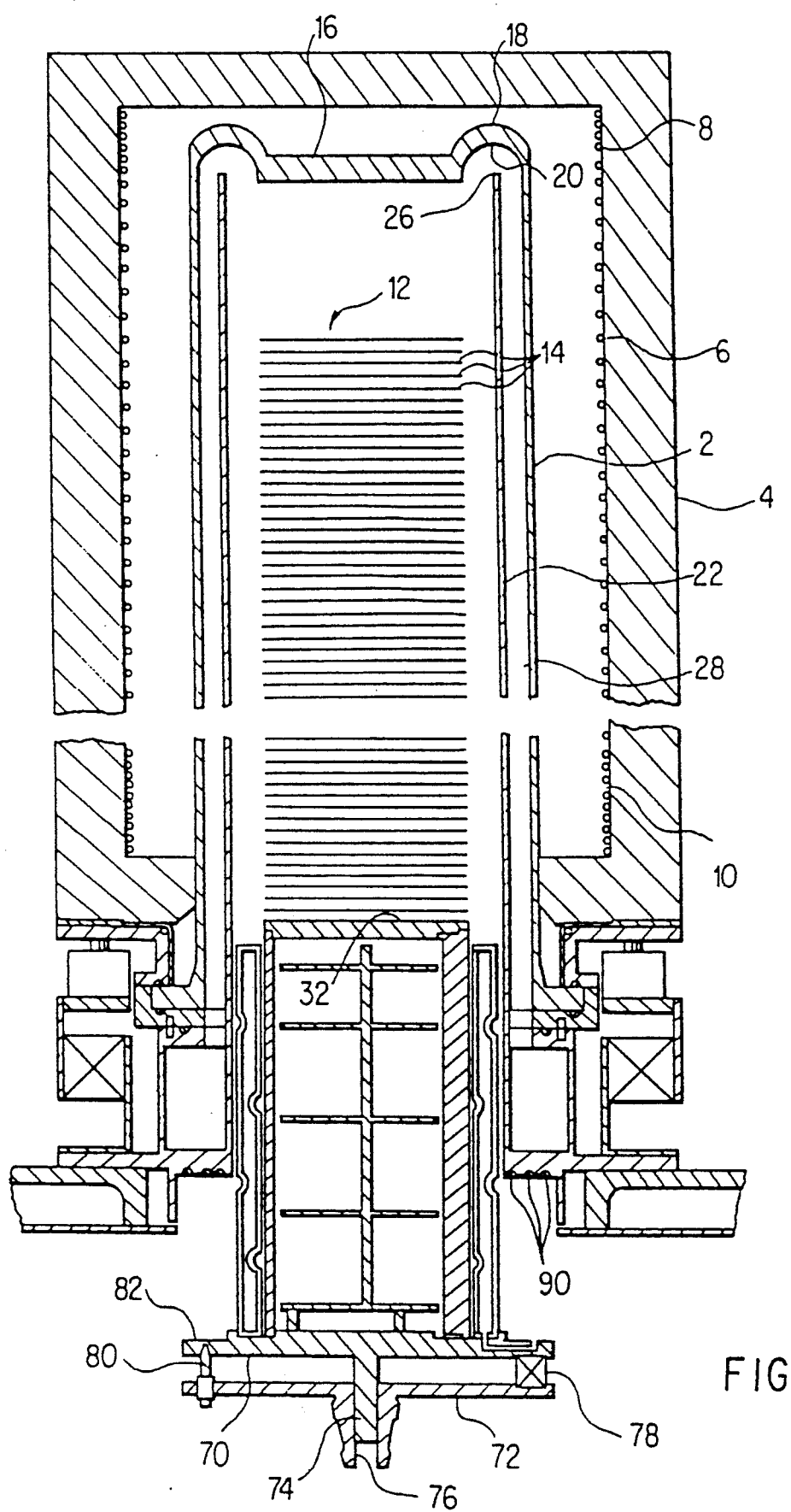
FIG. 4 is a cross-sectional view of the chemical vapor deposition apparatus of FIG. 1 showing the wafer boat and supporting base in a partially removed position.

FIG. 4 is a cross-sectional view of the chemical vapor deposition apparatus of FIG. 1 showing the wafer boat and supporting base in a partially removed position. The load door 70 supporting the reaction gas heaters and pedestal plate 32 is rotatably mounted on a load door adapter plate 72 by axial rod 74 and axial rod receptor 76 and support bearings 78. The alignment of the load door adapter plate 72 and load door 70 is assured by alignment pin 80 on the adapter plate 72 and pin receptor 82 in the load door 70. Lowering the load door adaptor plate 72 lowers the pedestal plate 32 and wafer boat supported thereon. To unload a wafer boat after processing is completed, the adaptor plate 72 is lowered until the wafer boat is completely removed from the reaction chamber (not shown). The process is reversed to load a wafer boat into the reaction zone for processing.

Load door seals 90 are O-rings which form a disconnect vacuum seal between the reaction chamber housing and the load door surface. Coolant channel 92 (FIG. 2 and FIG. 3) positioned adjacent seals 90 removes heat from the sealing surfaces to protect the seals. The seals break and are re-established automatically upon respective lowering and raising of the load door assembly from and to the upper position.

Figure 5:
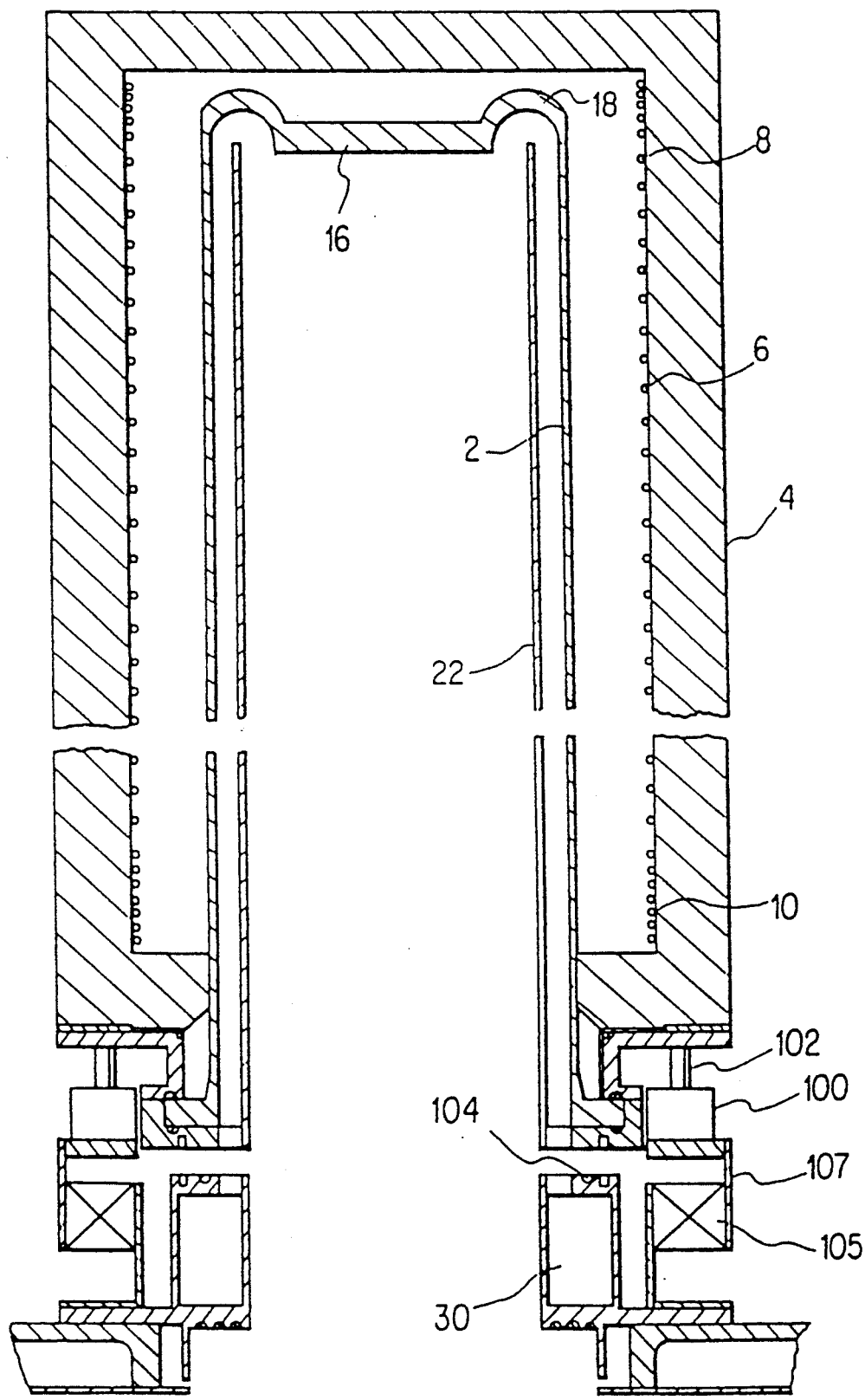
FIG. 5 is a cross-sectional view of the chemical vapor deposition apparatus of FIG. 1 after complete removal of wafer boat and supporting base, showing separation of the lower section of the housing from the upper section to access the vacuum tube for maintenance.

FIG. 5 is a cross-sectional view of the chemical vapor deposition apparatus of FIG. 1 after complete removal of wafer boat and supporting base, showing separation of the lower section of the housing from the upper section to access the vacuum tube for maintenance. Lift mechanism 100 and jack screw 102 raise the heater housing, and associated vacuum tube 2 and reaction tube 22 from the exhaust plenum 30 housing. The vacuum seal formed by O-ring seal 104 is broken by the operation and is reformed by reversing the operation. The slide set 105 slides by the cylindrical support 107 during this operation.

Referring again to FIG. 2 and FIG. 3, the bottom of the vacuum tube 2 has a foot flange 106 which is held between bumper ring 108 and tube retaining flange 110. Seals with the foot flange are formed by O-rings 112 and 114. The heat in the metal areas around the seals is removed by cooling liquid flowing through coolant channels 116.

The seal assemblies have no fittings, permitting the rapid making and breaking of vacuum seals in the assembly for convenient maintenance.

Figure 6:
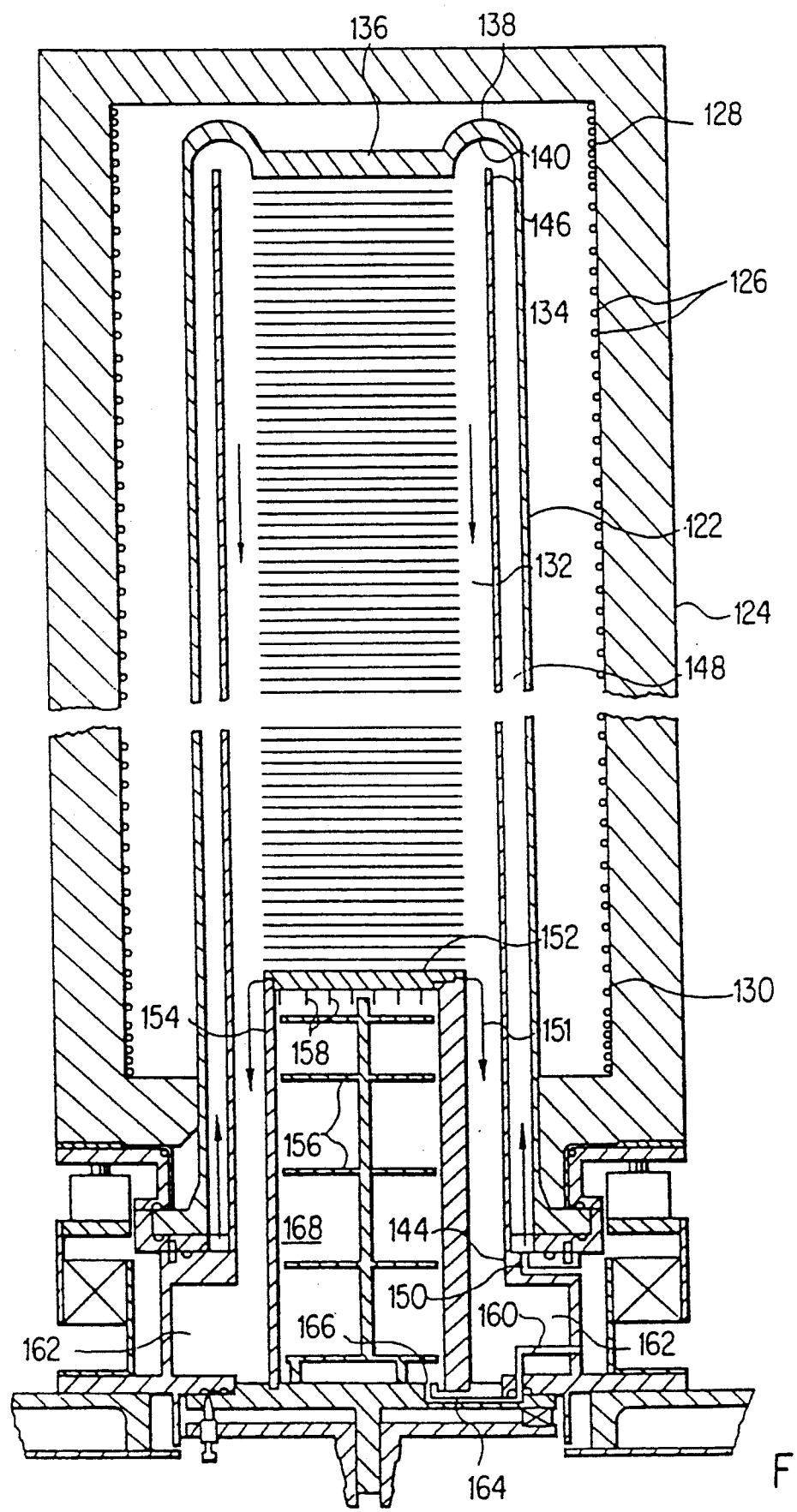
FIG. 6 is a cross-sectional view of another embodiment of a chemical vapor deposition apparatus of this invention, characterized in having a reaction gas flow pattern direction which is opposite to the flow pattern of the reaction gas in the embodiment of FIG. 1.

FIG. 6 is a cross-sectional view of another embodiment of a chemical vapor deposition apparatus according to this invention, characterized in having an downward flow of reaction gases along a wafer stack zone, a direction opposite to the reaction gas flow in the embodiment of FIG. 1. The vacuum chamber tube 122 is enclosed in a cylindrical heater housing 124 with resistance heating elements 126. The end sections 128 and 130 of the resistance heating elements are more closely spaced to provide more heat at the ends of the reactor assembly, these being sites of maximum heat loss from the reaction zone. This can provide a more uniform or nearly isothermal temperature throughout the reaction zone, if desired.

The wafer boat zone 132 is represented by a stack of wafers 134. The upper end of the vacuum chamber tube includes a central disk 136 which abuts or is closely adjacent the upper (upstream) end of the wafer boat zone 132 to minimize or eliminate eddy space between the disk and the upper surface of a wafer boat therein. The curved tube flange 138 extends from the periphery of the head disk 136 to the upper (upstream) end of the vacuum chamber tube 122 and closes the end of the vacuum chamber tube. The inner surface 140 of the tube flange 138 is preferably concave, for example having the shape of a section of a torus, that is, a curved concave surface having the shape of an arc or a section of a circle rotated about the central axis of the head disk 136. This shape maintains a laminar flow pattern of gases being directed thereby and strengthens the support for the head disk 136 under a vacuum load.

The reaction zone surrounding the wafer boat zone is defined by cylindrical reaction tube 142 The tube 142 extends from a base 144 to a position adjacent the curved surface 140 of the tube flange 138. The upper (upstream) end 146 of tube 142 and the opposing surface 140 define an inlet port for introducing reaction gases into the reaction zone. The space 148 between the reaction tube 142 and the vacuum chamber tube 122 defines a cylindrical inlet gas passageway for introducing gas to the inlet port from the gas supply injector 150. The gas supply injector 150 communicates with a conventional gas supply system (not shown). The space 148 also serves as a gas preheater since the gas is heated to the desired reaction temperature by the heating elements 126 and the heat received from through the cylindrical wall 142, exiting into the reaction zone at a precise preselected temperature.

The pedestal disk 152 supports the wafer boat and either contacts the lower surface of the wafer boat supported thereon or is closely adjacent thereto to eliminate a space within which a reaction gas eddy can occur.

Reactant depletion in gases flowing downward along the sides of the wafer stack 134 can be offset by introducing reactant gases 151 at the downstream end of the wafer stack. To preheat the reaction gases, the pedestal or base disk 152 can be the upper end closure of a secondary downstream reaction gas injector defined by secondary heater cylinder 154. Removable baffle plate unit 156 is enclosed in the secondary reaction gas injector to heat reaction gas passing therethrough. It is designed to have the surface area required to heat reaction gas passing through the secondary heater to the desired exit temperature. If more or less heat is required, the baffle unit 156 can be replaced with a baffle unit having a respective greater or lesser surface or gas contact area. Secondary reaction gas injectors or outlet ports 158 direct heated reaction gas into the reaction zone. Secondary reaction gas inlet supply conduit 160 extends through exhaust plenum 162 and communicates with base conduit 164 leading to outlet port 166 in the secondary heater cavity 168. The reaction gases pass downward to the exhaust plenum 162 which communicates with a conventional vacuum system (not shown).

The apparatus provides an improved CVD process. Process gases are separately heated to the desired reaction temperature and mixed immediately upstream of the wafers to be treated. The reaction gases are passed in laminar flow by the edges of the wafer in a direction perpendicular thereto and immediately removed from the reaction zone after passing the last wafer. The laminar flow without eddies is achieved by eliminating all stagnation areas and sharp corners from the gas flow zone with upstream and downstream plates preferably abutting the respective upstream and downstream ends of the wafer boat.

With the apparatus of the first embodiment of the invention shown in FIG. 1, the reaction gases can be separately preheated to the desired reaction temperature. The gases are then mixed and passed immediately in laminar flow past the wafers to be coated and then exhausted.

With the second embodiment shown in FIG. 6, the reaction gases and preferably a gas with a single reactant is heated to the reaction temperature as it passes upward, exiting into the reaction zone at the desired reaction temperature. The secondary reactant gases are also heated to the reaction temperature before they are injected through ports 158.

Prior to this invention, the reaction gases were mixed and heated in the reaction zone at a sufficient distance upstream of the wafers to permit the gases to rise to the desired coating reaction temperature. The gases reacted during the heating phase, forming particulates which were entrained in the gas and contaminated the wafer surfaces. Stagnation areas caused by obstructions, sharp angles and spaces between the wafer boat and end plates were present. This permitted eddy formation, recirculation and prolonged residence of portions of the reaction gases in the reaction zone and areas immediately upstream and downstream therefrom. Furthermore, many systems promoted non-laminar or turbulent flow in the reaction zone to achieve thorough mixing of the gases. This also promotes eddies and reaction gas retention. The particle formation is proportional to the residence time of the gases, and these defects contributed to particle formation.

With the apparatus of this invention, maximum laminar flow without eddies is achieved by eliminating stagnation areas, flow obstructions, sharp corners and spaces between the wafer boat and the end plates. This minimizes the residence time of all of the reaction gas molecules in the reaction zone and the areas immediately upstream and downstream therefrom.

We claim:

1. A chemical vapor deposition apparatus comprising a hot wall reaction tube means, a reaction gas preheater means, a reaction gas exhaust outlet, and substantially eddy-free reaction gas flow control means for passing reaction gases in a substantially laminar flow from the preheater means to the exhaust outlet, the hot wall reaction tube means enclosing a wafer boat zone for receiving a wafer boat preloaded with a stack of parallel substrates to be coated, with the wafer surfaces being substantially perpendicular to the central axis of the reaction tube, the wafer boat zone having an upstream end and a downstream end, wherein the hot wall reaction tube means is enclosed in an outer tube defining a vacuum chamber, the reaction tube and the outer tube having a space therebetween with an inlet opening communicating with the downstream end of the wafer boat zone and comprising the exhaust outlet, and wherein the gas flow control means includes a downstream tube flange positioned to be in a substantially eddy free relationship with the downstream end of the wafer boat zone, the flange having a curved surface means extending from the downstream end of the wafer boat zone to the outer tube for directing the reaction gas flow into the exhaust outlet while maintaining the gas in a state of substantially laminar flow.

2. A chemical vapor deposition apparatus comprising a hot wall reaction tube means, a reaction gas preheater means, a reaction gas exhaust outlet, and substantially eddy-free reaction gas flow control means for passing reaction gases in a substantially laminar flow from the preheater means to the exhaust outlet, the hot wall reaction tube means enclosing a wafer boat zone for receiving a wafer boat preloaded with a stack of parallel substrates to be coated, with the wafer surfaces being substantially perpendicular to the central axis of the reaction tube, the wafer boat zone having an upstream end and a downstream end, wherein the hot wall reaction tube means is enclosed in an outer tube defining a vacuum chamber, the reaction tube and the outer tube having a space therebetween comprising an inlet gas passageway and with an inlet opening communicating with the upstream end of the wafer boat zone and comprising the reaction gas inlet, the inlet gas passageway comprising a reaction gas preheater means, and wherein the gas flow control means includes a upstream tube flange positioned to be in a substantially eddy free relationship with the upstream end of the wafer boat zone, the flange having a curved surface means extending from the upstream end of the wafer boat zone to the outer tube for directing the reaction gas flow from an the inlet gas supply passageway while maintaining the gas in a state of substantially laminar flow.

3. A chemical vapor deposition apparatus comprising a hot wall reaction tube means, a reaction gas preheater means, a reaction gas exhaust outlet, and substantially eddy-free reaction gas flow control means for passing reaction gases in a substantially laminar flow from the preheater means to the exhaust outlet, the hot wall reaction tube means enclosing a wafer boat zone for receiving a wafer boat preloaded with a stack of parallel substrates to be coated, with the wafer surfaces being substantially perpendicular to the central axis of the reaction tube, the wafer boat zone having an upstream end and a downstream end, the reaction gas preheater means comprising a removable two wall cylindrical heater with inner surface deformations providing a surface area selected to transfer a predetermined amount of heat to reaction gas passing over the internal surface deformations and a heating tube having a removable baffle with a surface area selected to transfer a predetermined amount of heat to reaction gas passing over the surface of the baffle, wherein the two wall cylindrical heater and the heating tube each have a plurality of gas injector ports.

4. A chemical vapor deposition apparatus of claim 3 wherein the outlet ports of the cylindrical heater and the outlet ports of the heating tube each have central axes positioned to cause immediate mixing of gases injected therefrom.

* * * * *

UNITED STATES PATENT AND TRADEMARK OFFICE
CERTIFICATE OF CORRECTION

PATENT NO. : 5,320,680
DATED : June 14, 1994
INVENTOR(S) : Arthur J. Learn et al.

It is certified that error appears in the above-identified patent and that said Letters Patent is hereby corrected as shown below:

Title Page    item number 73 ( Assignee ), change "ThermCo Systems, Inc." to --Silicon Valley Group, Inc.--.

Signed and Sealed this

Eleventh Day of April, 2000

*Attest:*

Q. TODD DICKINSON

*Attesting Officer*      *Director of Patents and Trademarks*